(12) United States Patent
Trimberger et al.

(10) Patent No.: US 8,058,707 B1
(45) Date of Patent: Nov. 15, 2011

(54) SEMICONDUCTOR DEVICES HAVING REDUNDANT THROUGH-DIE VIAS AND METHODS OF FABRICATING THE SAME

(75) Inventors: Stephen M. Trimberger, San Jose, CA (US); Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 76 days.

(21) Appl. No.: 12/041,610

(22) Filed: Mar. 3, 2008

(51) Int. Cl.
*H01L 21/44* (2006.01)
*H01L 23/48* (2006.01)
*H01L 29/41* (2006.01)

(52) U.S. Cl. . 257/621; 257/696; 257/774; 257/E23.145; 438/667; 438/672; 438/675

(58) Field of Classification Search .................. 257/621, 257/686, 698
See application file for complete search history.

(56) References Cited

U.S. PATENT DOCUMENTS

| | | | |
|---|---|---|---|
| 6,127,733 A * | 10/2000 | Kinoshita | 257/773 |
| 6,762,478 B2 * | 7/2004 | Ahn et al. | 257/531 |
| 6,989,583 B2 * | 1/2006 | Fujii | 257/621 |
| 7,518,398 B1 | 4/2009 | Rahman et al. | |
| 2004/0119144 A1 * | 6/2004 | Figueroa et al. | 257/621 |
| 2006/0202347 A1 * | 9/2006 | Egawa | 257/774 |
| 2007/0290361 A1 * | 12/2007 | Chen | 257/773 |
| 2008/0258309 A1 * | 10/2008 | Chiou et al. | 257/774 |

OTHER PUBLICATIONS

U.S. Appl. No. 11/701,807, filed Feb. 1, 2007, Rahman, Arifur et al., Xilinx Inc., 2100 Logic Drive, San Jose, CA.
U.S. Appl. No. 12/041,612, filed Mar. 3, 2008, Rahman, Arifur et al., Xilinx Inc., 2100 Logic Drive, San Jose, CA.
U.S. Appl. No. 11/796,101, filed, Apr. 25, 2007, Rahman, Arifur, et al., Xilinx, Inc. 2100 Logic Drive, San Jose, CA 95124.
Mutschler, Ann Steffora, "IBM details 3-D chip stacking breakthrough", Apr. 12, 2007, 2 pages, Electronic News, Semiconductor International, Reed Electronic Group, http://www.reedelectronics.com/semiconductor/article/CA6433308?spacedesc&industryid=3026.
Rahman, Arifur et al., "Die Stacking Technology for Terabit Chip-to-Chip Communications", Proceedings of 2006 IEEE Custom Integrated Circuits Conference (CICC), Sep. 10-13, 2006, available from IEEE, 3 Park Avenue, 17th Floor, New York, NY 10016-5997.

\* cited by examiner

*Primary Examiner* — Ha Tran T Nguyen
*Assistant Examiner* — Raj R Gupta
(74) *Attorney, Agent, or Firm* — Robert M. Brush; LeRoy D. Maunu; Thomas George

(57) ABSTRACT

Semiconductor devices having redundant through-die vias (TDVs) and methods of fabricating the same are described. A substrate is provided having conductive interconnect formed on an active side thereof. Through die vias (TDVs) are formed in the substrate between a backside and the active side thereof. The TDVs include signal TDVs, redundant TDVs (i.e., redundant signal TDVs), and power supply TDVs. The signal TDVs are spaced apart from the redundant TDVs to form a pattern of TDV pairs. The power supply TDVs are interspersed among the TDV pairs. The conductive interconnect includes first signal conductors electrically coupling each of the signal TDVs to a respective one of the redundant TDVs defining a respective one of the TDV pairs.

19 Claims, 6 Drawing Sheets

US 8,058,707 B1

SEMICONDUCTOR DEVICES HAVING REDUNDANT THROUGH-DIE VIAS AND METHODS OF FABRICATING THE SAME

FIELD OF THE INVENTION

One or more aspects of the present invention relate generally to semiconductor devices and, more particularly, to semiconductor devices having redundant through-die vias (TDVs) and methods of fabricating the same.

BACKGROUND

As semiconductor technology has advanced, the amount and speed of logic available on an integrated circuit (IC) has increased more rapidly than the number and performance of input/output (I/O) connections. As a result, IC die stacking techniques have received renewed interest to address the interconnection bottleneck of high-performance systems. In stacked IC applications, two or more ICs are stacked vertically, and interconnections between them are made by wire bonding at chip periphery or by forming high aspect ratio through die vias (TDVs). There are several approaches for stacking ICs. Multiple silicon device layers can be grown epitaxially or fully processed ICs can be bonded for vertical integration.

SUMMARY

An aspect of the invention relates to semiconductor devices. A substrate is provided having conductive interconnect formed on an active side thereof. Through die vias (TDVs) are formed in the substrate between a backside and the active side thereof. The TDVs include signal TDVs, redundant TDVs (i.e., redundant signal TDVs), and power supply TDVs. The signal TDVs are spaced apart from the redundant TDVs to form a pattern of TDV pairs. The power supply TDVs are interspersed among the TDV pairs. The conductive interconnect includes first signal conductors electrically coupling each of the signal TDVs to a respective one of the redundant TDVs defining a respective one of the TDV pairs.

Another aspect of the invention relates to methods of fabricating semiconductor devices. TDVs are formed in a substrate between a backside and an active side thereof. The TDVs include signal TDVs, redundant TDVs (i.e., redundant signal TDVs), and power supply TDVs. The signal TDVs are spaced apart from the redundant TDVs to form a pattern of TDV pairs. The power supply TDVs are interspersed among the TDV pairs. Conductive interconnect is formed on the active side of the substrate. The conductive interconnect includes first signal conductors that electrically couple each of the signal TDVs to a respective one of the redundant TDVs defining a respective one of the TDV pairs.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION OF THE DRAWINGS

During fabrication, defects in through die vias (TDVs) may decrease the overall yield of IC dice designed for die stacking. Thus, it is desirable to include redundant TDVs on the IC dice in an attempt to improve yields. Depending on the positioning of the redundant TDVs, however, the failure mechanism that causes defects in a signal TDV may also cause defects in the respective redundant TDV. As such, it is desirable to space a pair of coupled TDVs far enough apart that a failure is less likely to affect both TDVs in the pair. At the same time, it is desirable to pack TDVs closely to maximize the number of TDVs on a particular IC die. Accordingly, there exists a need in the art for improved semiconductor devices having redundant TDVs and methods of fabricating the same.

Figure 1:
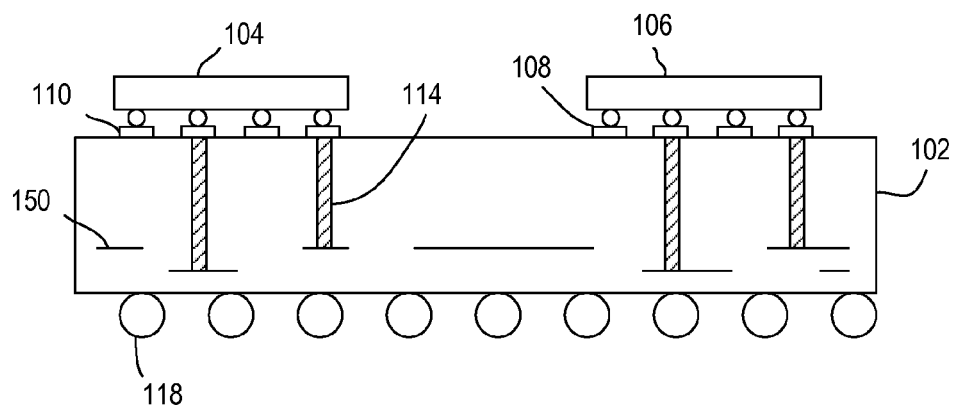
FIG. 1 is a cross-sectional view showing an exemplary embodiment of a semiconductor device in accordance with one or more aspects of the invention.

FIG. 1 is a cross-sectional view showing an exemplary embodiment of a semiconductor device 100 in accordance with one or more aspects of the invention. The semiconductor device 100 includes a first die 102, a second die 104, and a third die 106. The first die 102, the second die 104, and the third die 106 may comprise any type of digital, analog, and/or mixed-signal ICs known in the art. In a specific non-limiting embodiment, the first die 102 comprises a field programmable gate array (FPGA), and the second and third dice 104 and 106 comprise digital, analog, and/or mixed-signal ICs that provide auxiliary functions for the FPGA. In general, the first, second, and third dice 102-106 may comprise any type of ICs known in the art.

The second die 104 and the third die 106 are vertically stacked with the first die 102. In some embodiments, each of the dice 102, 104, and 106 is configured for face-down mounting in flip-chip fashion. The term "active side" denotes the side of a die that receives the bulk of semiconductor processing such that circuitry is fabricated on that active side of the die. The active side of the die is also sometimes referred to as the "face side". The side of a die opposite the active side is referred to as the backside of the die. Thus, the active side of the second die 104, and the active side of the third die 106, may be mounted to the backside of the first die 102.

In particular, each of the second die 104 and the third die 106 includes circuitry and conductive interconnect formed on a semiconductor substrate (not shown), as is conventionally known in the art. The first die 102 includes circuitry formed on a semiconductor substrate and conductive interconnect 150 formed over the circuitry. The conductive interconnect 150 generally includes a plurality of metal layers patterned using known photolithography techniques and electrically interconnected by patterns of vias. Suitable materials for the metal layers include, for example, aluminum, chromium, titanium, nickel, iridium, copper, gold, tungsten, silver, platinum, palladium, tantalum, molybdenum, or alloys of such materials. The metal layers are separated from one another by layers of insulator material, such as silicon dioxide ($SiO_2$), phospho-Silicate Glass (PSG), Boron-Doped PSG (BPSG), tetraethyl-ortho-silicate (TEOS), and the like.

The first die 102 also includes an array of bump contacts 118 formed on the active side for flip-chip mounting to a carrier. The first die 102 further includes an array of contacts 110 and an array of contacts 108, each formed on the backside thereof. The second die 104 is electrically and mechanically coupled to the contacts 110. The third die 106 is electrically and mechanically coupled to the contacts 108. The first die 102 further includes through-die vias (TDVs) 114 extending from the backside thereof to the conductive interconnect 150 on the active side thereof. The TDVs 114 electrically couple the second die 104 and the third die 106 to the conductive interconnect of the first die 102.

Notably, one or more of the TDVs 114 may be electrically interconnected through a metal layer in the conductive interconnect 150. As described above, in some embodiments, pairs of the TDVs 114 are electrically coupled through one or more metal layers in the conductive interconnect 150 to provide redundancy. Exemplary patterns of the TDVs 114 are described below. Such patterns allow for closely spaced TDVs in order to maximize the number of TDVs in the first die 102, while at the same time allowing sufficient space between paired TDVs to decrease the probability that both TDVs in any pair are affected by a defect.

The TDVs 114 allow circuitry on the first die 102 to communicate with circuitry on the second die 104 and the third die 106. Note the difference between vias in the conductive interconnect 150 and the TDVs 114. Vias in the conductive interconnect 150 provide electrical connections between metal layers therein. The TDVs 114 provide electrical connections between the contacts 108 and 110 and the conductive interconnect 150 and physically extend through the substrate of the first die 102. Fabrication of the TDVs 114 is well known in the art.

Figure 2:
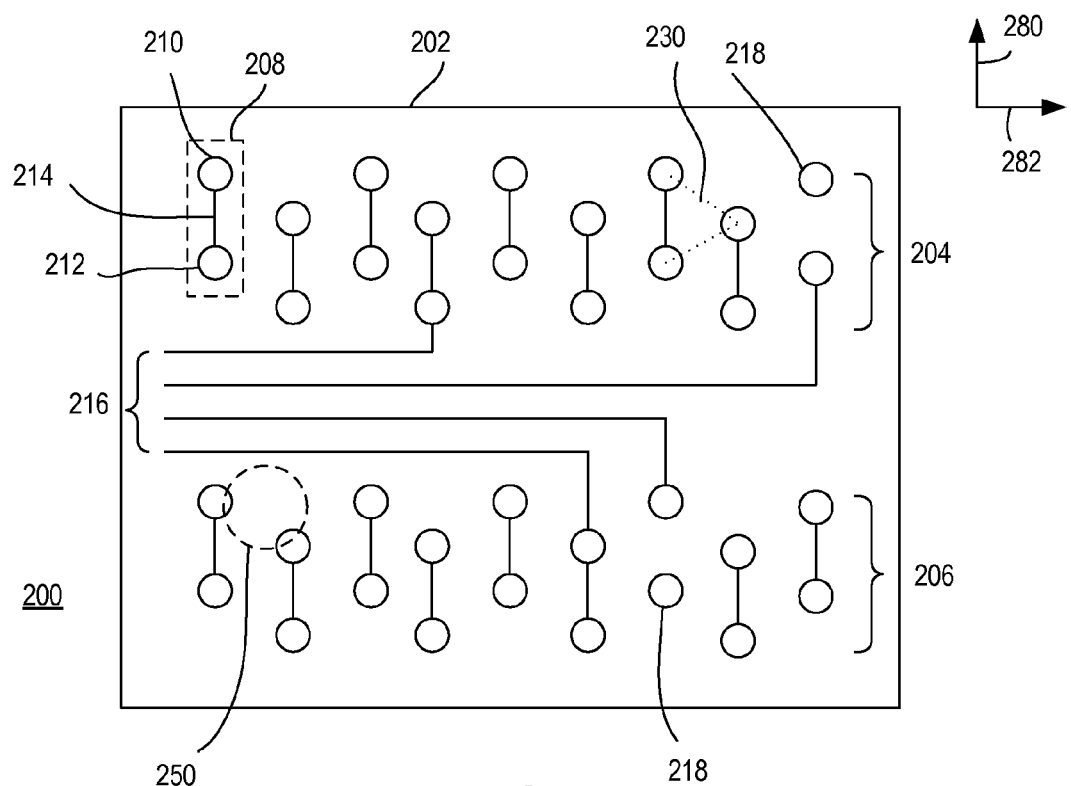
FIG. 2 is block diagram depicting an exemplary embodiment of a first TDV pattern in accordance with one or more aspects of the invention.

FIG. 2 is a block diagram depicting an exemplary embodiment of a TDV pattern 200 in accordance with one or more aspects of the invention. For example, the TDVs 114 in the first die 102 may be formed in the TDV pattern 200. In FIG. 2, a substrate 202 is viewed from the top (e.g., active side). The TDVs 114 are shown as circles, and conductors of the conductive interconnect 150 are shown as lines. The TDVs 114 include signal TDVs 210, redundant TDVs (i.e., redundant signal TDVs) 212, and power supply TDVs 218. The signal TDVs 210 and the redundant TDVs 212 are configured to communicate digital or analog signals. The power supply TDVs 218 are configured to provide power and ground (i.e., some of the power supply TDVs 218 provide power, and others provide ground). The pattern 200 is oriented with respect to a horizontal axis 282 perpendicular to a vertical axis 280 in a plane of the substrate 202. It is to be understood that the terms horizontal and vertical are relative depending on viewpoint and are merely used for purposes of exposition of the pattern 200 (e.g., horizontal and vertical may be interchanged).

The signal TDVs 210 are spaced apart from the redundant TDVs 212 to form a repeating pattern of TDV pairs 208. A TDV pair 208 includes one of the signal TDVs 210 and one of the redundant TDVs 212, which are spaced apart along the vertical axis 280 and electrically coupled by a signal conductor 214. The signal conductors 214 coupling TDV pairs 208 are part of the conductive interconnect 150 (the signal conductors 214 may be referred to as first signal conductors). In one specific non-limiting embodiment, the signal conductors 214 comprise a portion of the top-most metal layer in the conductive interconnect 150. In general, the signal conductors 214 may be implemented using one or more metal layers in the conductive interconnect 150, and may include vias (not shown) interconnecting these metal layers. The power supply TDVs 218 may be interspersed among the TDV pairs 208.

In the present embodiment, the pattern 200 includes rows of TDV pairs 208, for example, a row 204 and a row 206 are shown. The term "row" is relative, and is used to be consistent with the exemplary horizontal and vertical axes 282 and 280. The rows 204 and 206 extend along the horizontal axis 282. The rows 204 and 206 may further include pairs of the power supply TDVs 218, which may be configured similarly to the TDV pairs 208, but without the signal conductor 214. The TDV pairs 208 (and pairs of the power supply TDVs 218, if present) in each of the rows 204 and 206 can be alternately staggered along the vertical axis 280. Thus, TDVs in a TDV pair 208 are separated along the vertical axis 280 by a TDV in another pair, which may be for a different signal.

In the pattern 200, the TDVs in a pair 208 can be separated by an arbitrarily large distance dependent on a TDV pitch 230. Moreover, each TDV in a pair may be spaced closer to another unrelated TDV than to its partner in the TDV pair. In the pattern 200, the TDV pitch 230 can be defined as the distance between diagonally adjacent TDVs (i.e., adjacent TDVs from different TDV pairs 208 that are spaced apart in both the horizontal and vertical axes 280 and 282). It is therefore apparent that the TDVs in a TDV pair 208 are spaced farther apart than diagonally adjacent TDVs (e.g., unrelated TDVs). Depending on the selected TDV pitch, defects, such as a defect 250, may impact diagonally adjacent TDVs, but not both TDVs in a TDV pair 208. In this manner, TDVs in a pair 208 may be spaced apart by any desired distance. The distance between TDVs in a pair 208 may be selected based on the size of a typical defect region, such as the defect region 250. The size of a typical defect region may be determined by experimentation.

In some embodiments, additional conductors 216 may be routed between rows in the pattern 200, e.g., between the rows 204 and 206 (the additional signal conductors 216 may be referred to as second conductors). The conductors 216 may be formed on one or more metal layers in the conductive interconnect 150, and may include vias (not shown) interconnecting these metal layers. The conductors 216 may include one or more power supply conductors coupled to one or more of the power supply TDVs 218. The conductors 216 may include one or more signal conductors coupled to one or more of the signal TDVs 210 and/or the redundant TDVs 212.

Figure 3:
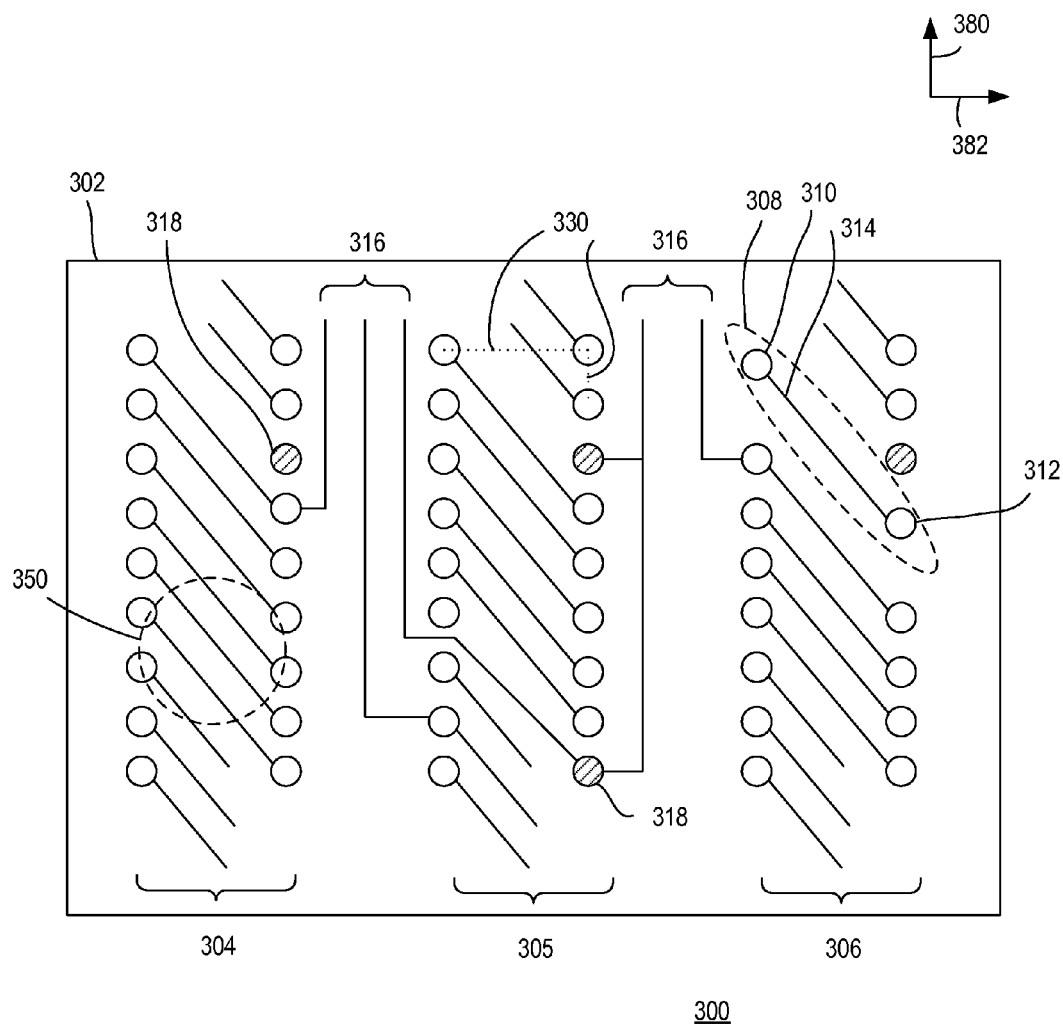
FIG. 3 is block diagram depicting an exemplary embodiment of a second TDV pattern in accordance with one or more aspects of the invention.

FIG. 3 is a block diagram depicting an exemplary embodiment of a TDV pattern 300 in accordance with one or more aspects of the invention. For example, the TDVs 114 in the first die 102 may be formed in the TDV pattern 300. In FIG. 3, a substrate 302 is viewed from the top (e.g., active side). The TDVs 114 are shown as circles and conductors of the conductive interconnect 150 are shown as lines. The TDVs 114 include signal TDVs 310, redundant TDVs (i.e., redundant signal TDVs) 312, and power supply TDVs 318. The signal TDVs 310 and the redundant TDVs 312 are configured to communicate digital or analog signals. The power supply TDVs 318 are configured to provide power and ground (i.e., some of the power supply TDVs 318 provide power, and others provide ground). The pattern 300 is oriented with respect to a horizontal axis 382 perpendicular to a vertical axis 380 in a plane of the substrate 302. It is to be understood that the terms horizontal and vertical are relative depending on viewpoint and are merely used for purposes of exposition of the pattern 300 (e.g., horizontal and vertical may be interchanged).

The signal TDVs 310 are spaced apart from the redundant TDVs 312 to form a repeating pattern of TDV pairs 308. A TDV pair 308 includes one of the signal TDVs 310 and one of the redundant TDVs 312, which are spaced apart along both the vertical and horizontal axes 380 and 382 (e.g., diagonally) and electrically coupled by a signal conductor 314. Moreover, each TDV in a pair may be spaced closer to another unrelated TDV than to its partner in the TDV pair. The signal conductors 314 coupling TDV pairs 308 are part of the conductive interconnect 150 (the signal conductors 314 may be referred to as first signal conductors). In one specific non-limiting embodiment, the signal conductors 314 comprise a portion of the top-most metal layer in the conductive interconnect 150. In general, the signal conductors 314 may be implemented using one or more metal layers in the conductive interconnect 150, and may include vias (not shown) interconnecting these metal layers. The power supply TDVs 318 may be interspersed among the TDV pairs 308.

In the present embodiment, the pattern 300 includes columns of TDV pairs 308, for example, columns 304, 305, and 306 are shown. The term "column" is relative, and is used to be consistent with the exemplary horizontal and vertical axes 382 and 380. The columns 304-306 extend along the vertical axis 380. For each TDV pair 308 in each of the columns 304-306, the signal TDV 310 is spaced apart from the redundant TDV 312 along both the horizontal and vertical axes 382 and 380 (i.e., diagonally spaced apart). In the present example, the signal conductors 314 directly connect respective TDVs in a pair 308 and are thus diagonally disposed on the substrate 302. The power supply TDVs 318 may be interspersed among the TDV pairs 308.

In the pattern 300, the TDVs in a pair 308 can be separated by an arbitrarily large distance dependent on a TDV pitch 330. In the pattern 300, the TDV pitch 330 can be defined as the horizontal and vertical distance between adjacent TDVs (i.e., adjacent TDVs from different TDV pairs 308 that are spaced apart in either the horizontal axis 382 or the vertical axis 380). It is therefore apparent that the TDVs in a TDV pair 308 are spaced farther apart than horizontally and vertically adjacent TDVs. Depending on the selected TDV pitch, defects, such as a defect 350, may impact horizontally and/or vertically adjacent TDVs, but not both diagonally separated TDVs in a TDV pair 308.

Notably, the connections between TDVs in a pair 308 may be made diagonally at any angle. The angle may be defined by the number of TDV pitches 330 along the vertical axis 380 that separate the TDVs in a pair 308. In the present example, three TDV pitches 330 separate the TDVs in a pair 308, yielding an approximate angle of 71 degrees (a ratio of 1:3 with respect to TDV pitch). Those skilled in the art will appreciate that other angles may be employed, such as ratios of 1:5 or 1:10, for example. In this manner, TDVs in a pair 308 may be spaced apart by any desired distance. The distance between TDVs in a pair 308 may be selected based on the size of a typical defect region, such as the defect region 350. The size of a typical defect region may be determined by experimentation.

In some embodiments, additional conductors 316 may be routed between columns of TDV pairs in the pattern 300, e.g., between the columns 304 and 305, and/or between the columns 305 and 306 (the additional signal conductors 316 may be referred to as second conductors). The conductors 316 may be formed on one or more metal layers in the conductive interconnect 150, and may include vias (not shown) interconnecting these metal layers. The conductors 316 may include one or more power supply conductors coupled to one or more of the power supply TDVs 318. The conductors 316 may include one or more signal conductors coupled to one or more of the signal TDVs 310 and/or the redundant TDVs 312.

Notably, the pattern 300 takes advantage of the large TDV pitch 330 relative to a wiring pitch of conductors in the conductive interconnect 150. The conductors in the conductive interconnect 150 are formed with a different process and can be tested and known to be good when the TDVs are formed. A plurality of the conductors 316 can be formed between columns (i.e., within one TDV pitch 330), since wire pitch (e.g., on the order of 500 nm) is smaller than TDV pitch 330 (e.g., on the order of 10-20 microns). This also allows the conductors 316 to be routed between TDVs (e.g., to connect to the power supply TDVs 318).

Figure 4:
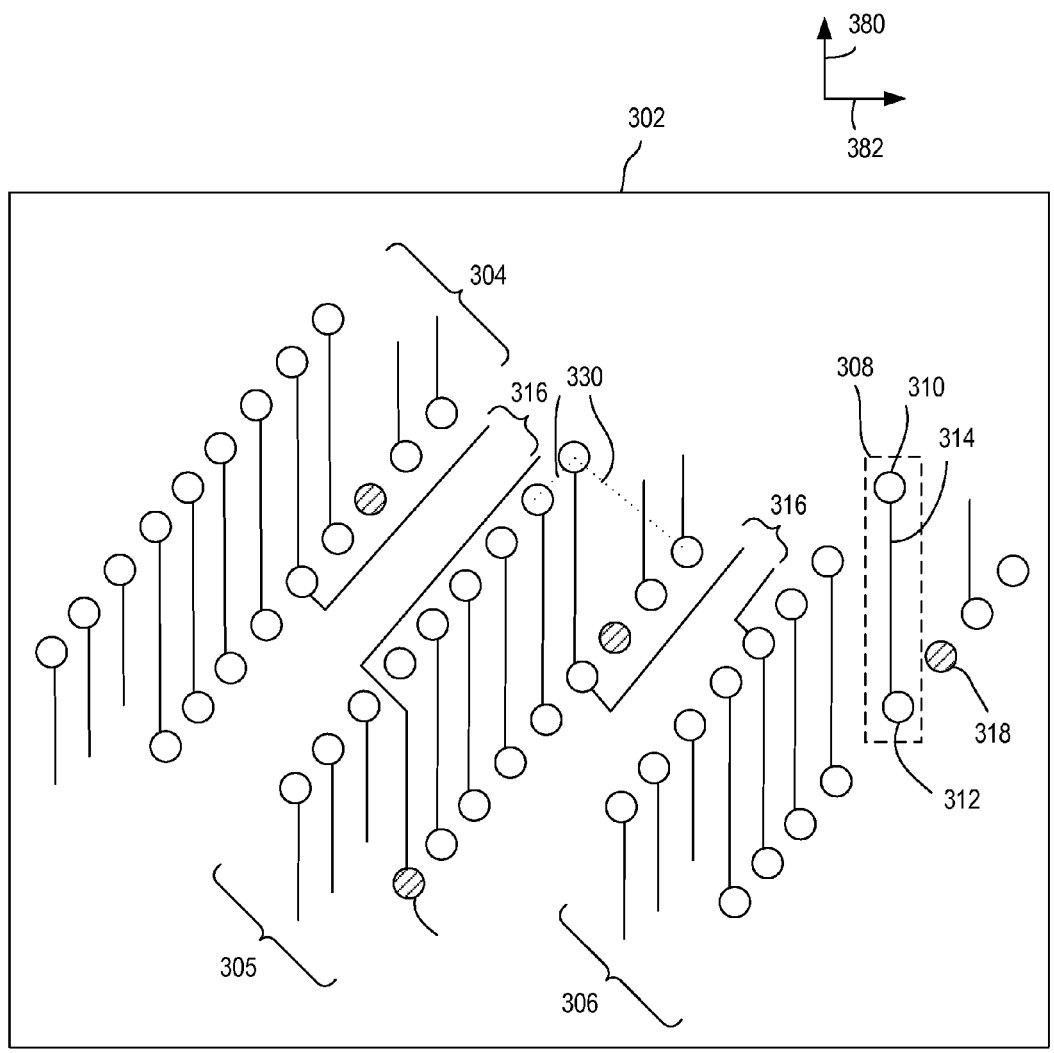
FIG. 4 is block diagram depicting an exemplary embodiment of a third TDV pattern in accordance with one or more aspects of the invention.

FIG. 4 is a block diagram depicting an exemplary embodiment of a TDV pattern 400 in accordance with one or more aspects of the invention. In the pattern 400, the signal conductors 314 are disposed diagonally on the substrate 302. In some fabrication techniques, it may be necessary to avoid diagonally formed conductors. In such case, the pattern 400 may be implemented. In the pattern 400, elements that are the same or similar to those of the pattern 300 are designated with identical reference numerals and are described above. In some embodiments, the pattern 400 is the pattern 300 rotated (clockwise in the present example) by an angle complementary to the angle of the signal conductors 314. In the example of the pattern 300 above, the signal conductors 314 are at approximately 71 degrees. Thus, in the example of the pattern 400, the pattern 300 is rotated clockwise approximately 19 degrees. In this manner, the signal conductors 314 in the pattern 400 extend along only the vertical axis 380, instead of diagonally. Those skilled in the art will appreciate that the pattern 400 may be formed by rotating the pattern 300 clockwise or counterclockwise by other angles, such that the signal conductors 314 extend along only one of the vertical axis 380 or the horizontal axis 382.

Figure 5:
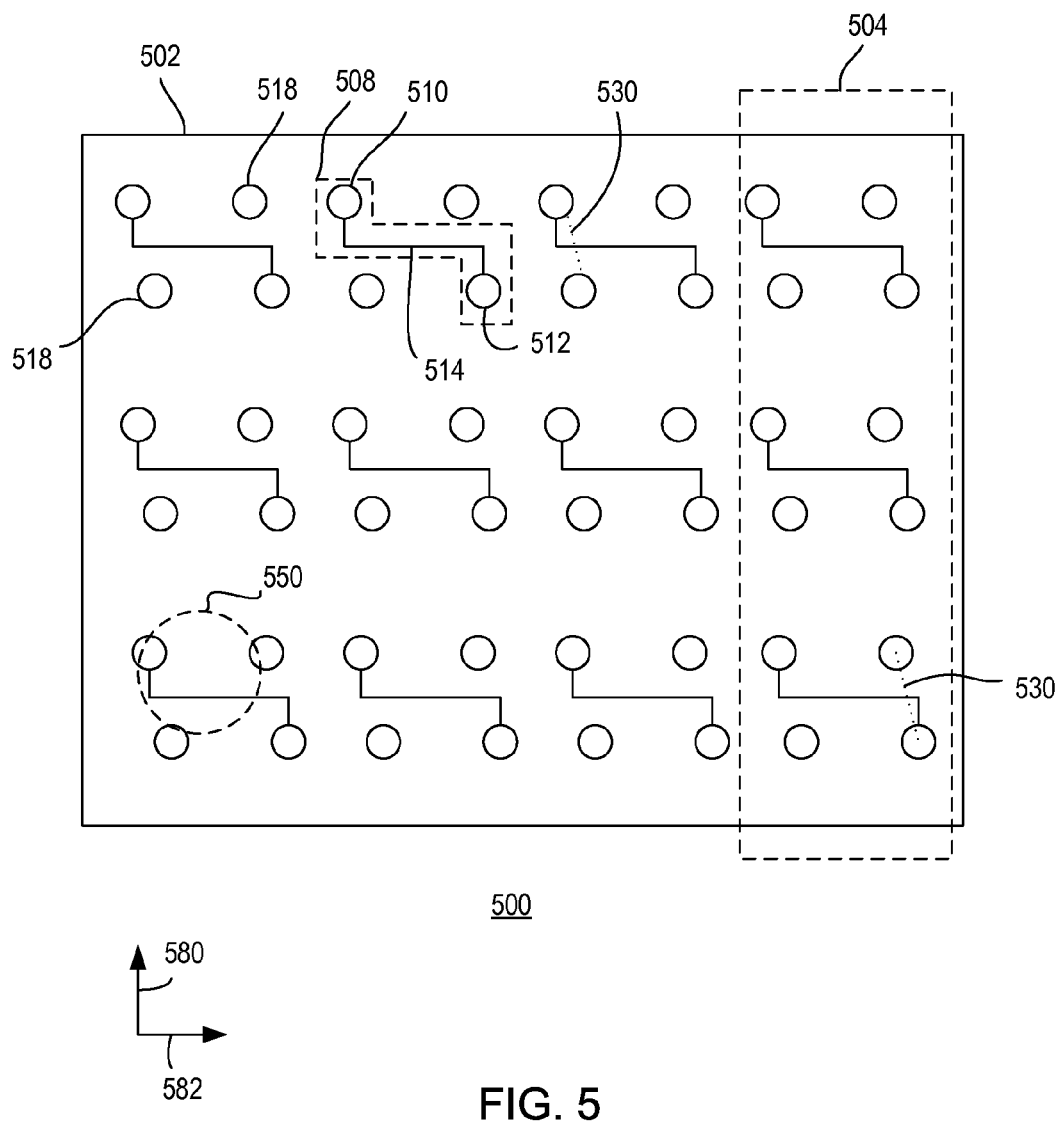
FIG. 5 is block diagram depicting an exemplary embodiment of a fourth TDV pattern in accordance with one or more aspects of the invention.

FIG. 5 is a block diagram depicting an exemplary embodiment of a TDV pattern 500 in accordance with one or more aspects of the invention. For example, the TDVs 114 in the first die 102 may be formed in the TDV pattern 500. In FIG. 5, a substrate 502 is viewed from the top (e.g., active side). The TDVs 114 are shown as circles and conductors of the conductive interconnect 150 are shown as lines. The TDVs 114 include signal TDVs 510, redundant TDVs (i.e., redundant signal TDVs) 512, and power supply TDVs 518. The signal TDVs 510 and the redundant TDVs 512 are configured to communicate digital or analog signals. The power supply TDVs 518 are configured to provide power and ground (i.e., some of the power supply TDVs 518 provide power, and others provide ground). The pattern 500 is oriented with respect to a horizontal axis 582 perpendicular to a vertical axis 580 in a plane of the substrate 502. It is to be understood that the terms horizontal and vertical are relative depending on viewpoint and are merely used for purposes of exposition of the pattern 500 (e.g., horizontal and vertical may be interchanged).

The signal TDVs 510 are spaced apart from the redundant TDVs 512 to form a repeating pattern of TDV pairs 508. A TDV pair 508 includes one of the signal TDVs 510 and one of the redundant TDVs 512, which are spaced apart along both the vertical and horizontal axes 580 and 582 (e.g., diagonally) and electrically coupled by a signal conductor 514. Moreover, each TDV in a pair may be spaced closer to another unrelated TDV than to its partner in the TDV pair. The signal conductors 514 coupling TDV pairs 508 are part of the conductive interconnect 150 (the signal conductors 514 may be referred to as first signal conductors). In one specific non-limiting embodiment, the signal conductors 514 comprise a portion of the top-most metal layer in the conductive interconnect 150. In general, the signal conductors 514 may be implemented using one or more metal layers in the conductive interconnect 150, and may include vias (not shown) interconnecting these metal layers. The power supply TDVs 518 may be interspersed among the TDV pairs 508.

In the present embodiment, the pattern 500 includes columns 504 of TDV pairs 508. The term "column" is relative, and is used to be consistent with the exemplary horizontal and vertical axes 582 and 580. The columns 504 extend along the vertical axis 580. For each TDV pair 508 in each of the columns 504, the signal TDV 510 is spaced apart from the redundant TDV 512 along both the horizontal and vertical axes 582 and 580 (i.e., diagonally spaced apart). In the present example, each signal conductor 514 includes at least one horizontal component coincident with the horizontal axis 582 and at least one vertical component coincident with the vertical axis 580. In the present example, each signal conductor 514 includes one horizontal component and two vertical components. The power supply TDVs 518 may be interspersed among the TDV pairs 508.

In the pattern 500, the TDVs in a pair 508 can be separated by an arbitrarily large distance dependent on a TDV pitch 530. It is apparent that the TDVs in a TDV pair 508 are spaced farther apart than adjacent TDVs. Depending on the selected TDV pitch, defects, such as a defect 550, may impact adjacent TDVs, but not both diagonally separated TDVs in a TDV pair 508.

Figure 6:
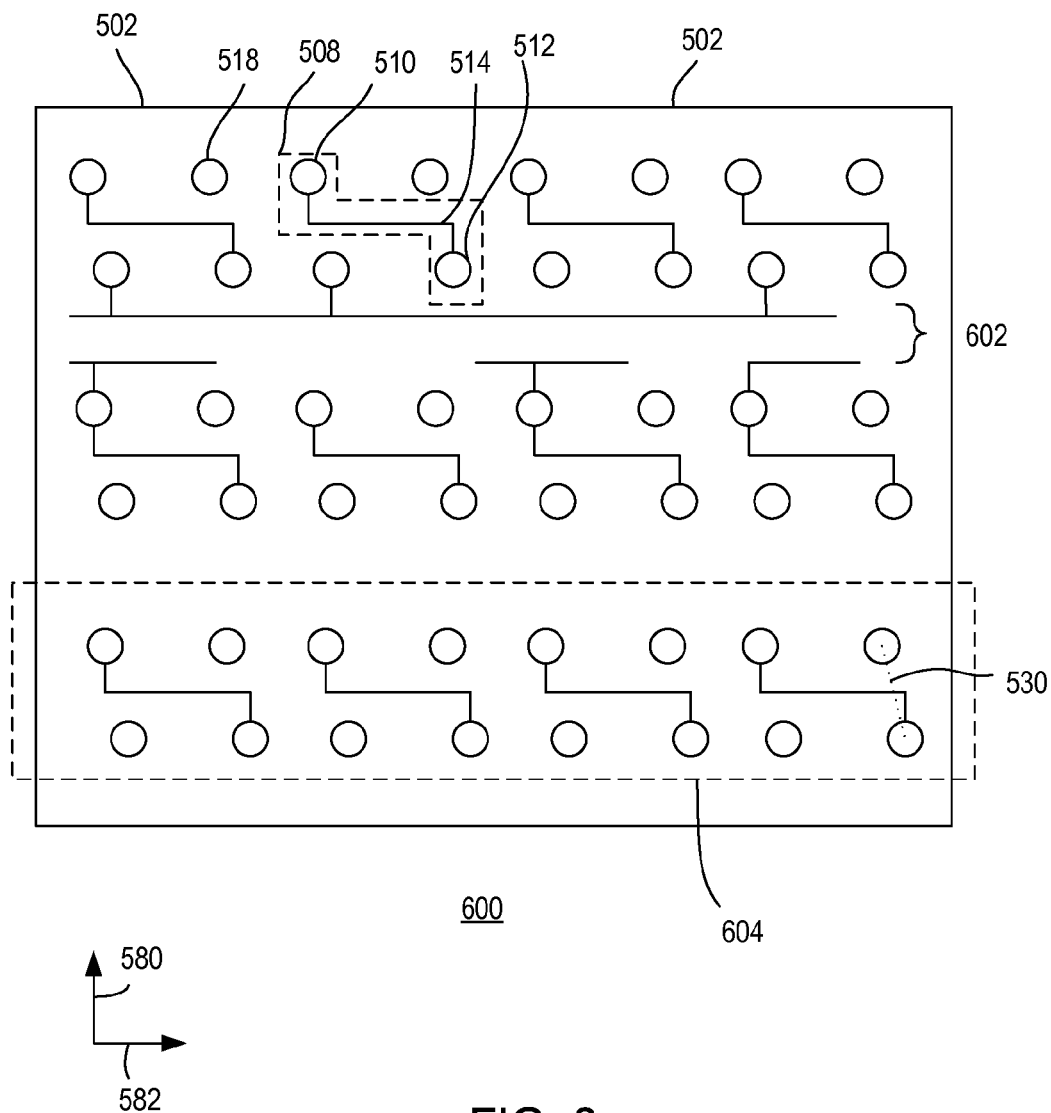
FIG. 6 is block diagram depicting an exemplary embodiment of a fifth TDV pattern in accordance with one or more aspects of the invention.

FIG. 6 is a block diagram depicting another exemplary embodiment of a TDV pattern 600 in accordance with one or more aspects of the invention. Elements in FIG. 6 that are the same or similar to those of FIG. 5 are designated with identical reference numerals and are described in detail above. In the exemplary pattern 600, the pattern 500 is adjusted to include space for horizontal conductors 602. For example, rows 604 of TDV pairs 508 can be separated to provide space for the horizontal conductors 602. The conductors 602 may be formed on one or more metal layers in the conductive interconnect 150, and may include vias (not shown) interconnecting these metal layers. The conductors 602 may include one or more power supply conductors coupled to one or more of the power supply TDVs 518. The conductors 602 may include one or more signal conductors coupled to one or more of the signal TDVs 510 and/or the redundant TDVs 512. In other embodiments, rather than horizontal conductors 602, vertical conductors may be provided. That is, columns of the TDV pairs 508 may be separated to provide space for vertical conductors.

Figure 7:
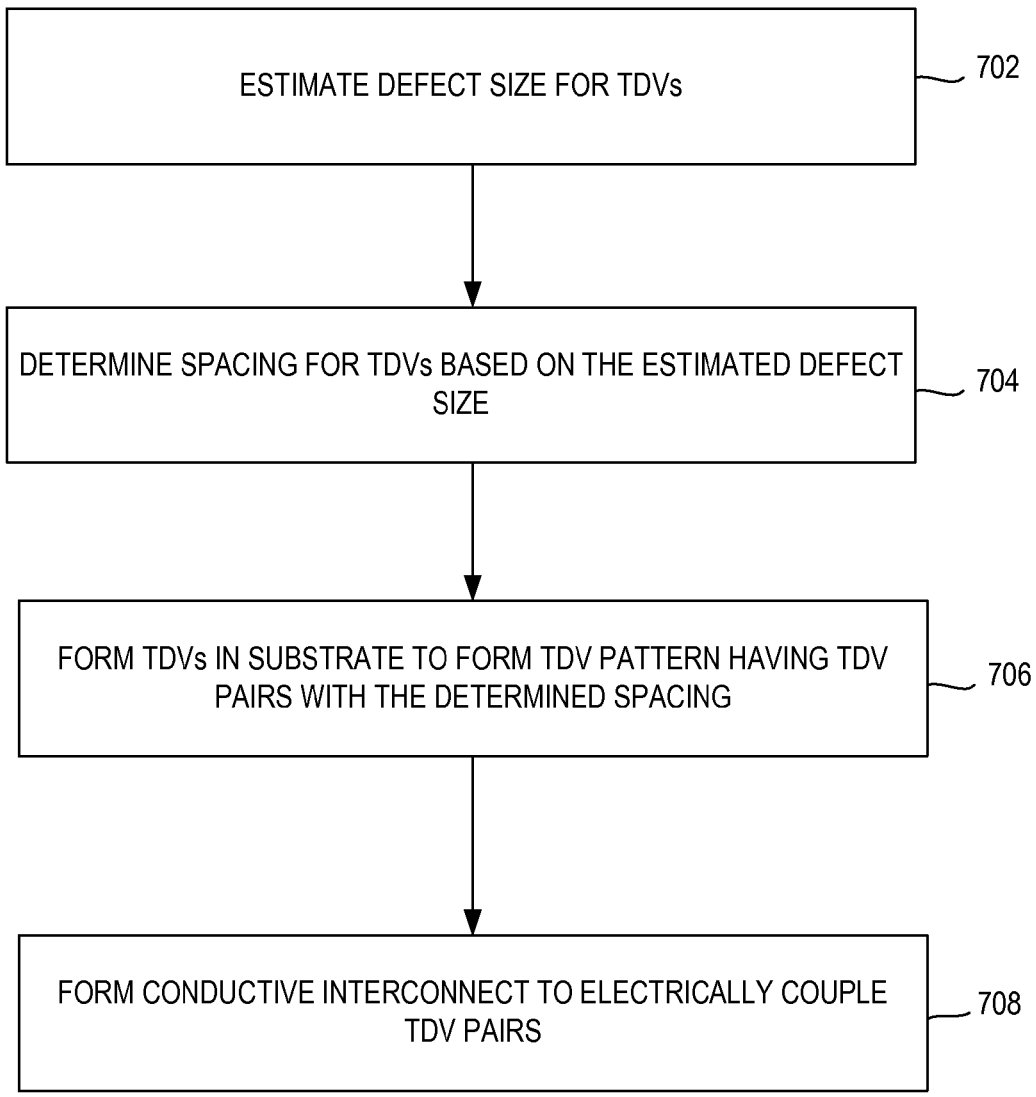
FIG. 7 is a flow diagram depicting an exemplary embodiment of a method of fabricating a semiconductor device in accordance with one or more aspects of the invention.

FIG. 7 is a flow diagram depicting an exemplary embodiment of a method 700 of fabricating a semiconductor device in accordance with one or more aspects of the invention. In the method 700, the term "substrate" is meant to encompass a single die or a wafer having multiple dice. At step 702, a defect size is estimated for TDVs to be formed. For example, a defect size may be estimated based on experimental statistics related to TDV defects using a given process. At step 704, a spacing for the signal TDVs and the redundant TDVs is determined based on the estimated defect size. Signal TDVs and corresponding redundant TDVs should be spaced apart by a distance larger than the estimated defect size. At step 706, TDVs are formed in a substrate between a backside and an active side thereof to form a TDV pattern having pairs of signal TDVs and redundant TDVs with interspersed power supply TDVs. That is, the TDVs include signal TDVs, redundant TDVs, and power supply TDVs. The signal TDVs are spaced apart from the redundant TDVs to form a pattern of TDV pairs. The redundant TDVs are spaced apart from the corresponding signal TDVs according to the spacing determined in step 704. The power supply TDVs are interspersed among the TDV pairs in the pattern. Processes for forming TDVs in a substrate are well known in the art.

At step 708, conductive interconnect is formed on the active side of the substrate to form signal conductors that electrically couple the TDV pairs formed in step 702. Processes for forming conductive interconnect on a substrate are well known in the art.

Semiconductor devices having redundant TDVs and methods of fabricating the same are described. In some embodiments, a semiconductor device includes a pattern of TDVs formed therein. The TDVs include signal TDVs, redundant TDVs, and power supply TDVs. In some embodiments, the signal TDVs are spaced apart from the redundant TDVs to form a pattern of TDV pairs. The power supply TDVs are interspersed among the TDV pairs. Conductive interconnect on the device includes signal conductors that electrically couple the signal TDVs with the redundant TDVs. Those skilled in the art will appreciate that although the invention has been described with respect to TDV pairs, embodiments of the invention may also include TDV groups (i.e., more than one redundant TDV for a corresponding signal TDV). In general, a group of TDVs may be configured such that the separation between one or more of the TDVs mitigates the probability that all TDVs in a group will be affected by an estimated defect size.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. A semiconductor device, comprising:
   a substrate having conductive interconnect formed on an active side thereof; and
   through die vias (TDVs) formed in the substrate between a backside and the active side thereof, the TDVs including signal TDVs, redundant TDVs, and power supply TDVs, the signal TDVs being spaced apart from the redundant TDVs to form a pattern of TDV pairs, the power supply TDVs being interspersed among the TDV pairs,
   wherein the conductive interconnect includes first signal conductors electrically coupling each of the signal TDVs to a respective one of the redundant TDVs defining a respective one of the TDV pairs;
   wherein, for each TDV pair of the TDV pairs, one TDV in the TDV pair is spaced closer to an unrelated TDV of the TDVs than the one TDV is spaced from the other TDV in the TDV pair.

2. The semiconductor device of claim 1, wherein the pattern is oriented with respect to a horizontal axis perpendicular to a vertical axis in a plane of the substrate, the pattern including rows of the TDV pairs extending along the horizontal axis, the TDV pairs in each of the rows being alternately staggered along the vertical axis.

3. The semiconductor device of claim 2, wherein the conductive interconnect further includes second conductors routed between the rows of the TDV pairs.

4. The semiconductor device of claim 1, wherein the pattern is oriented with respect to a horizontal axis perpendicular to a vertical axis in a plane of the substrate, the pattern including groups of the TDV pairs wherein, for each TDV pair in each of the groups, the signal TDV is spaced apart from the redundant TDV along only one of the vertical axis or the horizontal axis.

5. The semiconductor device of claim 4, wherein, for each TDV pair in each of the columns, the first signal conductor electrically coupling the signal TDV and the redundant TDV is coincident with the one of the vertical axis and the horizontal axis along which the signal TDV and the redundant TDV are spaced.

6. The semiconductor device of claim 5, wherein the conductive interconnect further includes second conductors routed between the groups of the TDV pairs.

7. The semiconductor device of claim 1, wherein the pattern is oriented with respect to a horizontal axis perpendicular to a vertical axis in a plane of the substrate, the pattern including columns of the TDV pairs extending along the vertical axis wherein, for each TDV pair in each of the columns, the signal TDV is spaced apart from the redundant TDV in both the vertical axis and the horizontal axis.

8. The semiconductor device of claim 7, wherein, for each TDV pair in each of the columns, the first signal conductor electrically coupling the signal TDV and the redundant TDV is disposed at an angle with respect to the vertical axis and the horizontal axis.

9. The semiconductor device of claim 8, wherein the conductive interconnect further includes second conductors routed between the columns of the TDV pairs.

10. The semiconductor device of claim 7, wherein, for each TDV pair in each of the columns, the first signal conductor electrically coupling the signal TDV and the redundant TDV includes at least one horizontal component coincident with the horizontal axis and at least one vertical component coincident with the vertical axis.

11. The semiconductor device of claim 10, wherein the conductive interconnect further includes second conductors routed between the TDV pairs.

12. A method of fabricating a semiconductor device, comprising:
forming through die vias (TDVs) in a substrate between a backside and an active side thereof, the TDVs including signal TDVs, redundant TDVs, and power supply TDVs, the signal TDVs being spaced apart from the redundant TDVs to form a pattern of TDV pairs, the power supply TDVs being interspersed among the TDV pairs; and
forming conductive interconnect on the active side of the substrate, the conductive interconnect having first signal conductors that electrically couple each of the signal TDVs to a respective one of the redundant TDVs defining a respective one of the TDV pairs;
wherein, for each TDV pair of the TDV pairs, one TDV in the TDV pair is spaced closer to an unrelated TDV of the TDVs than the one TDV is spaced from the other TDV in the TDV pair.

13. The method of claim 12, further comprising:
estimating a defect size for the TDVs; and
determining spacing between the signal TDVs and the redundant TDVs in the TDV pairs based on the defect size.

14. The method of claim 12, wherein the pattern is oriented with respect to a horizontal axis perpendicular to a vertical axis in a plane of the substrate, the pattern including rows of the TDV pairs extending along the horizontal axis, the TDV pairs in each of the rows being alternately staggered along the vertical axis.

15. The method of claim 14, wherein the conductive interconnect further includes second conductors routed between the rows of the TDV pairs.

16. The method of claim 12, wherein the pattern is oriented with respect to a horizontal axis perpendicular to a vertical axis in a plane of the substrate, the pattern including columns of the TDV pairs extending along the vertical axis wherein, for each TDV pair in each of the columns, the signal TDV is spaced apart from the redundant TDV in both the vertical axis and the horizontal axis.

17. The method of claim 16, wherein, for each TDV pair in each of the columns, the first signal conductor electrically coupling the signal TDV and the redundant TDV includes at least one horizontal component coincident with the horizontal axis and at least one vertical component coincident with the vertical axis.

18. The method of claim 16, wherein, for each TDV pair in each of the columns, the first signal conductor electrically coupling the signal TDV and the redundant TDV is disposed at an angle with respect to the vertical axis and the horizontal axis.

19. The method of claim 18, wherein the conductive interconnect further includes second conductors routed between the columns of the TDV pairs.

* * * * *